(12) United States Patent
Noh et al.

(10) Patent No.: US 10,495,918 B2
(45) Date of Patent: Dec. 3, 2019

(54) DISPLAY DEVICE COMPRISING COLOR FILTER

(71) Applicant: Samsung Display Co., Ltd., Yongin-si (KR)

(72) Inventors: Junghun Noh, Yongin-si (KR); Keunkyu Song, Seongnam-si (KR); Hyunsup Lee, Hwaseong-si (KR); Sanghee Jang, Bucheon-si (KR); Hyungil Jeon, Seoul (KR); Byungseok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 15/646,089

(22) Filed: Jul. 11, 2017

(65) Prior Publication Data

US 2018/0011371 A1 Jan. 11, 2018

(30) Foreign Application Priority Data

Jul. 11, 2016 (KR) .................. 10-2016-0087607

(51) Int. Cl.
*G02F 1/1335* (2006.01)
*G02F 1/1343* (2006.01)
(Continued)

(52) U.S. Cl.
CPC ...... *G02F 1/133514* (2013.01); *G02F 1/1368* (2013.01); *G02F 1/133512* (2013.01); *G02F 1/134336* (2013.01); *G02F 1/136286* (2013.01); *H01L 27/124* (2013.01); *H01L 27/1248* (2013.01); *H01L 27/322* (2013.01); *H01L 27/3276* (2013.01); *G02F 2001/133519* (2013.01); *G02F 2001/136222* (2013.01); *G02F 2201/08* (2013.01); *G02F 2201/123* (2013.01); *G02F 2202/10* (2013.01); *H01L 27/3262* (2013.01)

(58) Field of Classification Search
CPC ......... G02F 1/133514; G02F 1/133512; G02F 1/1368; G02F 1/134336; G02F 1/136286; H01L 27/124; H01L 27/1248
See application file for complete search history.

(56) References Cited

U.S. PATENT DOCUMENTS 6,436,591 B1 8/2002 Ohtsu et al.
6,741,031 B2 5/2004 Harada et al.
(Continued)

FOREIGN PATENT DOCUMENTS

JP 2003-208848 7/2003
JP 2007-140276 6/2007

*Primary Examiner* — Allen L Parker
*Assistant Examiner* — Gustavo G Ramallo
(74) *Attorney, Agent, or Firm* — H.C. Park & Associates, PLC (57) ABSTRACT

A display device includes: a first substrate and a second substrate disposed facing each other; a gate line and a first data line disposed on the first substrate; a thin film transistor connected to the gate line and the first data line; a pixel electrode connected to the thin film transistor; and a color filter disposed on at least one of the first substrate and the second substrate, the color filter overlapping the pixel electrode. The color filter has a width greater than a distance between the the first data line and a second data line disposed adjacent to the first data line.

16 Claims, 8 Drawing Sheets

(51) Int. Cl.
  *H01L 27/12*  (2006.01)
  *G02F 1/1362* (2006.01)
  *G02F 1/1368* (2006.01)
  *H01L 27/32*  (2006.01)

(56) References Cited

U.S. PATENT DOCUMENTS

| | | |
|---|---|---|
| 2002/0033927 A1 | 3/2002 | Mun et al. |
| 2005/0030658 A1* | 2/2005 | Ushiyama ................ G02B 5/22 |
| | | 359/891 |
| 2005/0074708 A1* | 4/2005 | Saluel ................... G03F 7/0007 |
| | | 430/394 |
| 2006/0118828 A1* | 6/2006 | Kim ................. G02F 1/134363 |
| | | 257/213 |
| 2006/0146128 A1 | 7/2006 | Ma et al. |
| 2011/0294243 A1 | 12/2011 | Jeon et al. |
| 2017/0277007 A1* | 9/2017 | Tseng ................ G02F 1/136209 |

* cited by examiner

DISPLAY DEVICE COMPRISING COLOR FILTER

CROSS-REFERENCE TO RELATED APPLICATION

This application claims priority from and the benefit of Korean Patent Application No. 10-2016-0087607, filed on Jul. 11, 2016, which is hereby incorporated by reference for all purposes as if fully set forth herein.

FIELD

Exemplary embodiments relate to a display device.

DISCUSSION OF THE BACKGROUND

Display devices may be classified into liquid crystal display ("LCD") devices, organic light emitting diode ("OLED") display devices, plasma display panel ("PDP") devices, electrophoretic display devices and the like based on a light emitting scheme of these devices.

A substrate of the display devices generally includes a thin film transistor ("TFT") switching a voltage applied to an electrode. The substrate further includes, in addition to the TFT, a wiring disposed thereon that includes a gate line and a data line, a gate driver and a data driver externally receiving signals and transferring the signals to the gate line and the data line, respectively. A pixel electrode electrically connected to the TFT is disposed in a light transmitting area defined by intersection of the gate line and the data line.

In addition, the display device generally includes a color filter disposed on the substrate and a light blocking layer disposed in a remaining area except for the light transmitting area. In such an exemplary embodiment, a boundary portion between adjacent ones of the color filters is positioned so as to overlap the light blocking layer on the data line.

As the display device becomes larger, a distance between pixels is further reduced and a width of the data line is reduced. Accordingly, because it is difficult to form the boundary portion between color filters that overlap the data line, color mixture or light leakage may be visually recognized since the color filter and the light blocking layer on the data line may be misaligned.

The above information disclosed in this Background section is only for enhancement of understanding of the background of the inventive concept. Therefore, it may contain information that does not form the prior art that was already known to a person of ordinary skill in the art or was publically available prior to an effective filing date of subject matter disclosed herein.

SUMMARY

Exemplary embodiments provide a display device capable of substantially preventing color mixture or light leakage due to misalignment of a color filter.

Additional aspects will be set forth in the detailed description which follows, and, in part, will be apparent from the disclosure, or may be learned by practice of the inventive concept.

According to an exemplary embodiment, a display device includes: a first substrate and a second substrate disposed facing each other; a gate line and a first data line disposed on the first substrate; a thin film transistor connected to the gate line and the first data line; a pixel electrode connected to the thin film transistor; and a color filter disposed on at least one of the first substrate and the second substrate, the color filter overlapping the pixel electrode. The color filter has a width greater than a distance between first data line and a second data line disposed adjacent to the first data line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
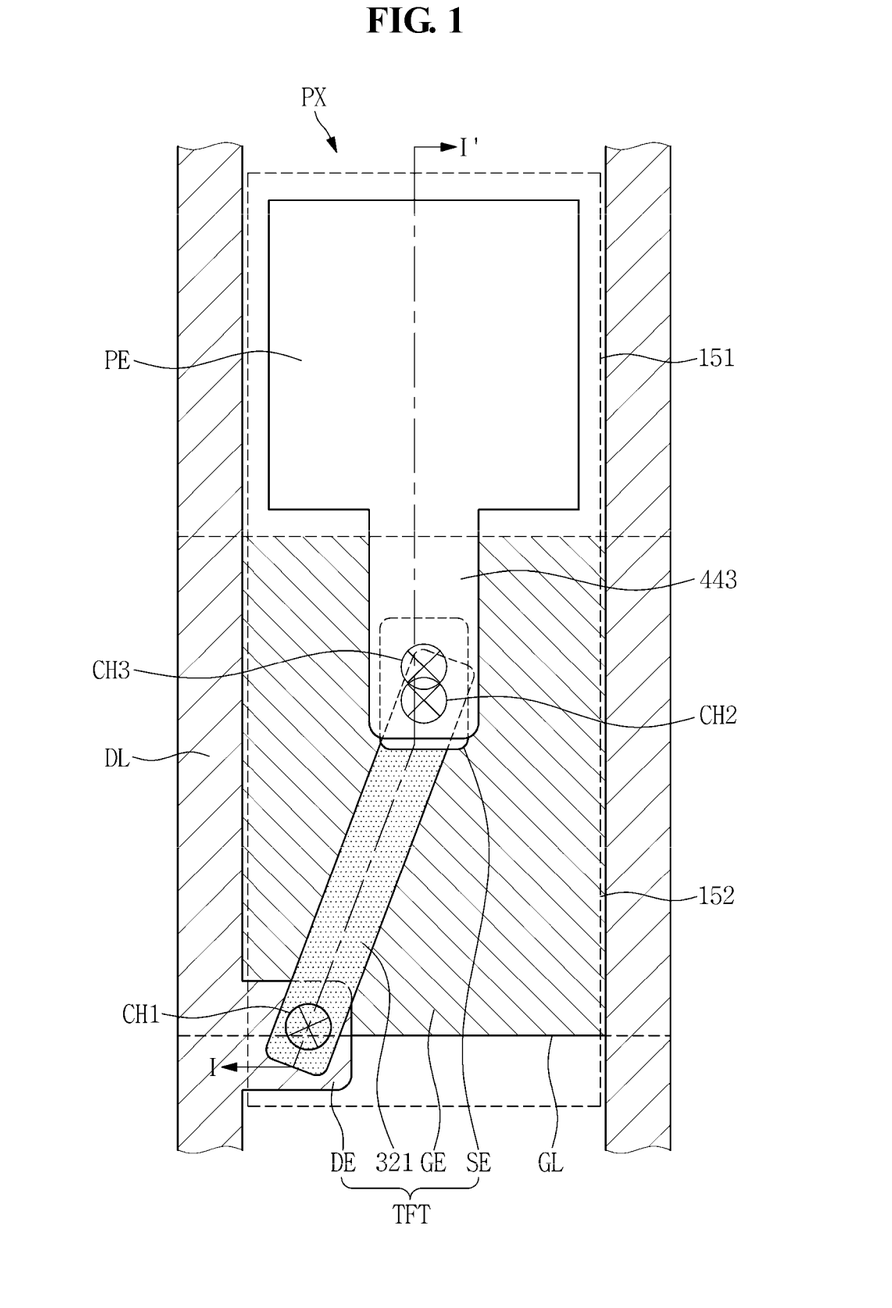
FIG. 1 is a plan view illustrating one pixel according to an exemplary embodiment.
Figure 2:
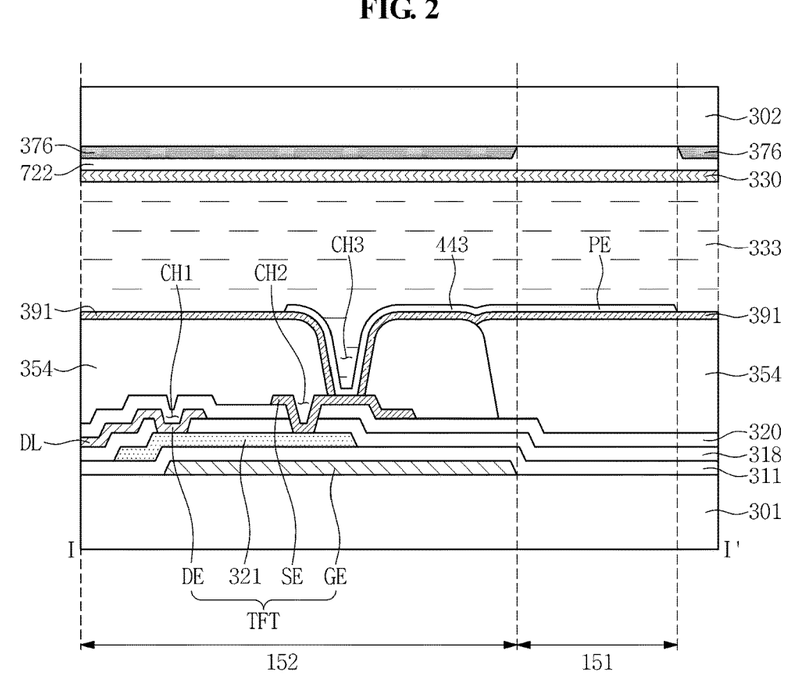
FIG. 2 is a cross-sectional view taken along line I-I' of FIG. 1.

FIG. 1 is a plan view illustrating one pixel according to an exemplary embodiment and FIG. 2 is a cross-sectional view taken along line I-I' of FIG. 1.

As illustrated in FIGS. 1 and 2, the pixel PX includes a thin film transistor ("TFT"), a gate insulating layer 311, an insulating interlayer 318, a protective layer 320, a color filter 354, a capping layer 391, a pixel electrode PE, a liquid crystal layer 333, a light blocking layer 376, an overcoat layer 722 and a common electrode 330.

As illustrated in FIG. 1, one pixel PX includes a light transmitting area 151 and a light blocking area 152. The pixel electrode PE is positioned at the light transmitting area 151 of the pixel PX and the TFT may be positioned at the light blocking area 152 of the pixel PX. The light transmitting area 151 may have a smaller area than that of the light blocking area 152. For example, an area ratio between the light transmitting area 151 and the light blocking area 152 may be in a range from about 3:7 to about 4:6.

The TFT may be connected to the gate line GL, the data line DL, and the pixel electrode PE. To this end, the TFT may include a gate electrode GE, a drain electrode DE connected to the data line DL, a source electrode SE connected to the pixel electrode PE, and a semiconductor layer 321 connected to the drain electrode DE and the source electrode SE.

The TFT, the gate line GL, the data line DL, the gate insulating layer 311, the insulating interlayer 318, the protective layer 320, the color filter 354, the capping layer 391 and the pixel electrode PE may be positioned on the first substrate 301.

The light blocking layer 376, the overcoat layer 722, and the common electrode 330 may be positioned on the second substrate 302.

The gate line GL may include a plurality of gate electrodes GE. In an exemplary embodiment, although not illustrated, a contact portion (e.g., an end portion) of the gate line GL may have a larger area than an area of another portion of the gate line GL for connection to another layer or an external driving circuit.

The gate line GL may include or be formed of one of: aluminum (Al) or alloys thereof, silver (Ag) or alloys thereof, copper (Cu) or alloys thereof, molybdenum (Mo) or alloys thereof. Alternatively, the gate line GL may include or be formed of one of: chromium (Cr), tantalum (Ta) and/or titanium (Ti). The gate line GL may have a multilayer structure including at least two conductive layers that have different physical properties.

The gate electrode GE may include a substantially same material and may have a substantially same structure (a multilayer structure) as those of the gate line GL. The gate line GL and the gate electrode GE may be formed simultaneously in a substantially same process.

As illustrated in FIG. 2, the gate insulating layer 311 is positioned on the gate line GL and the gate electrode GE. In such an exemplary embodiment, the gate insulating layer 311 may be positioned on an entire surface of the first substrate 301 including the gate line GL and the gate electrode GE. The gate insulating layer 311 may include or be formed of silicon nitride (SiNx) or silicon oxide (SiOx). The gate insulating layer 311 may have a multilayer structure including at least two insulating layers having different physical properties.

As illustrated in FIG. 2, the semiconductor layer 321 may be positioned on the gate insulating layer 311. As illustrated in FIGS. 1 and 2, the semiconductor layer 321 may overlap at least a portion of the gate electrode GE. The semiconductor layer 321 may include amorphous silicon or polycrystalline silicon.

As illustrated in FIG. 2, the insulating interlayer 318 may be positioned on the semiconductor layer 321 and the gate insulating layer 311. In such an exemplary embodiment, the insulating interlayer 318 is positioned on an entire surface of the first substrate 301 including the semiconductor layer 321. The insulating interlayer 318 may have first and second contact holes CH1 and CH2. The insulating interlayer 318 may include silicon nitride (SiNx), silicon oxide (SiOx), or the like. The insulating interlayer 318 may have a multilayer structure including at least two insulating layers having different physical properties.

As illustrated in FIG. 2, the data line DL and the drain electrode DE are positioned on the insulating interlayer 318. In such an exemplary embodiment, the drain electrode DE may be connected to the semiconductor layer 321 through the first contact hole CH1 of the insulating interlayer 318. Although not illustrated, an ohmic contact layer may further be positioned at an interface between the drain electrode DE and the semiconductor layer 321.

The ohmic contact layer may include silicide or n+ hydrogenated amorphous silicon doped with n-type impurity ions, e.g., phosphorus (P) and hydrogen fluoride ($PH_3$), at high concentration.

A contact portion (e.g., an end portion) of the data line DL may have a larger area than an area of another portion of the data line DL for connection to another layer or an external driving circuit.

The data line DL may intersect the gate line GL. Although not illustrated, a portion of the data line DL intersecting the gate line GL may have a less line width than that of another portion of the data line DL. Accordingly, a parasitic capacitance between the data line DL and the gate line GL may be reduced.

The data line DL may include or be formed of a refractory metal, such as molybdenum, chromium, tantalum, titanium and/or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer and a molybdenum (alloy) upper layer. In an alternative exemplary embodiment, the data line DL may include or be formed of any suitable metals and/or conductors rather than the aforementioned materials.

As illustrated in FIG. 1, the drain electrode DE protrudes from the data line DL. The drain electrode DE may be a part of the data line DL. The drain electrode DE may include a substantially same material and may have a substantially same structure (a multilayer structure) as those of the data line DL. The drain electrode DE and the data line DL may be manufacture substantially simultaneously in a substantially same process.

As illustrated in FIG. 2, the protective layer 320 is positioned on the data line DL, the drain electrode DE and the insulating interlayer 318. In such an exemplary embodiment, the protective layer 320 may be positioned on an entire surface of the first substrate 301 including the data line DL, the drain electrode DE and the insulating interlayer 318. The protective layer 320 may have a second contact hole CH2 defined through a part thereof.

The protective layer 320 may include an inorganic insulating material such as silicon nitride ($SiN_x$) or silicon oxide ($SiO_x$), and in such an exemplary embodiment, an inorganic insulating material having photosensitivity and a dielectric constant of about 4.0 may be used. Alternatively, the protective layer 320 may have a double-layer structure including a lower inorganic layer and an upper organic layer, which is found to impart excellent insulating properties and not to damage an exposed portion of the semiconductor layer 321. The protective layer 320 may have a thickness greater than or equal to about 5000 Å, e.g., in a range of about 6000 Å to about 8000 Å.

As illustrated in FIG. 2, the source electrode SE is positioned on the protective layer 320. In such an exemplary embodiment, the source electrode SE may be connected to the semiconductor layer 321 through the second contact hole CH2 defined in the protective layer 320 and the insulating interlayer 318. Although not illustrated, an ohmic contact layer may further be positioned at an interface between the source electrode SE and the semiconductor layer 321.

The source electrode SE may include a substantially same material and may have a substantially same structure (a multilayer structure) as those of the data line DL.

As illustrated in FIG. 2, the color filter 354 is positioned on the source electrode SE and the protective layer 320. An edge of the color filter 354 may be positioned on the gate line GL and the data line DL. However, the color filter 354 is not positioned at an area corresponding to the third contact hole CH3. The color filter 354 may include a photosensitive organic material.

In such an exemplary embodiment, an edge of one color filter 354 overlaps an edge of another color filter 354 adjacent thereto, which will be described in detail below.

As illustrated in FIG. 2, the capping layer 391 is positioned on the color filter 354. The capping layer 391 may substantially prevent an impurity generated from the color filter 354 from diffusing into the liquid crystal layer 333. The capping layer 391 may have a third contact hole CH3. The capping layer 391 may include silicon nitride, silicon oxide, or the like.

As illustrated in FIGS. 1 and 2, the pixel electrode PE is positioned on the capping layer 391 of the light transmitting area 151.

The pixel electrode PE may include a transparent conductive material, e.g., indium tin oxide (ITO) or indium zinc oxide (IZO). In such an exemplary embodiment, ITO may include a polycrystalline material or a monocrystalline material. As an example, IZO may include a polycrystalline material or a monocrystalline material. Alternatively, IZO may include an amorphous material.

A connection electrode 443 may be positioned on the capping layer 391. The connection electrode 443 may extend from the pixel electrode PE toward the light blocking area 152. The connection electrode 443 may be formed integrally with the pixel electrode PE. The connection electrode 443 may be positioned at the light transmitting area 151 and the light blocking area 152. The connection electrode 443 may be connected to the source electrode SE through the third contact hole CH3 of the capping layer 391.

The connection electrode 443 may include a substantially same material as that included in the pixel electrode PE. The connection electrode 443 and the pixel electrode PE may be formed substantially simultaneously in a substantially same process. Alternatively, the connection electrode 443 may include a substantially same material as that included in the source electrode SE. For example, the connection electrode 443 may be formed integrally with the source electrode SE. In such an exemplary embodiment, the connection electrode 443 and the source electrode SE are formed substantially simultaneously in a substantially same process. In such an exemplary embodiment, the connection electrode 443 is connected to the pixel electrode PE through a contact hole.

As illustrated in FIG. 2, the light blocking layer 376 is positioned on the second substrate 302. The light blocking layer 376 may be positioned in a remaining area except for the light transmitting area 151.

The overcoat layer 722 may be positioned on the light blocking layer 376. In such an exemplary embodiment, the overcoat layer 722 may be positioned on an entire surface of the second substrate 302 including the light blocking layer 376. The overcoat layer 722 may serve to substantially minimize a height difference between elements of the second substrate 302, e.g., the light blocking layer 371, between the overcoat layer 722 and the second substrate 302. The overcoat layer 722 may be omitted.

The common electrode 330 may be positioned on the overcoat layer 722. In such an exemplary embodiment, the common electrode 330 may be positioned on an entire surface of the second substrate 302 including the overcoat layer 722. Alternatively, the common electrode 330 may be positioned on the overcoat layer 722 corresponding to the light transmitting area 151. A common voltage may be applied to the common electrode 330.

In an exemplary embodiment, although not illustrated, the pixel PX may further include a first polarizing plate and a second polarizing plate. When facing surfaces of the first substrate 301 and the second substrate 302 are defined as upper surfaces of the corresponding substrates and surfaces on the opposite sides of the upper surfaces are respectively defined as lower surfaces of the corresponding substrates, the first polarizing plate may be positioned on the lower surface of the first substrate 301 and the second polarizing plate may be positioned on the lower surface of the second substrate 302.

A transmission axis of the first polarizing plate and a transmission axis of the second polarizing plate may be orthogonal to each other. One of these transmission axes may be arranged parallel to the gate line GL. However, the display device may include only one of the first polarizing plate and the second polarizing plate.

The first substrate 301 and the second substrate 302 may be insulating substrates including glass or plastic.

The liquid crystal layer 333 between the first substrate 301 and the second substrate 302 may include liquid crystal molecules. These liquid crystal molecules may be twisted nematic liquid crystal molecules.

Figure 3:
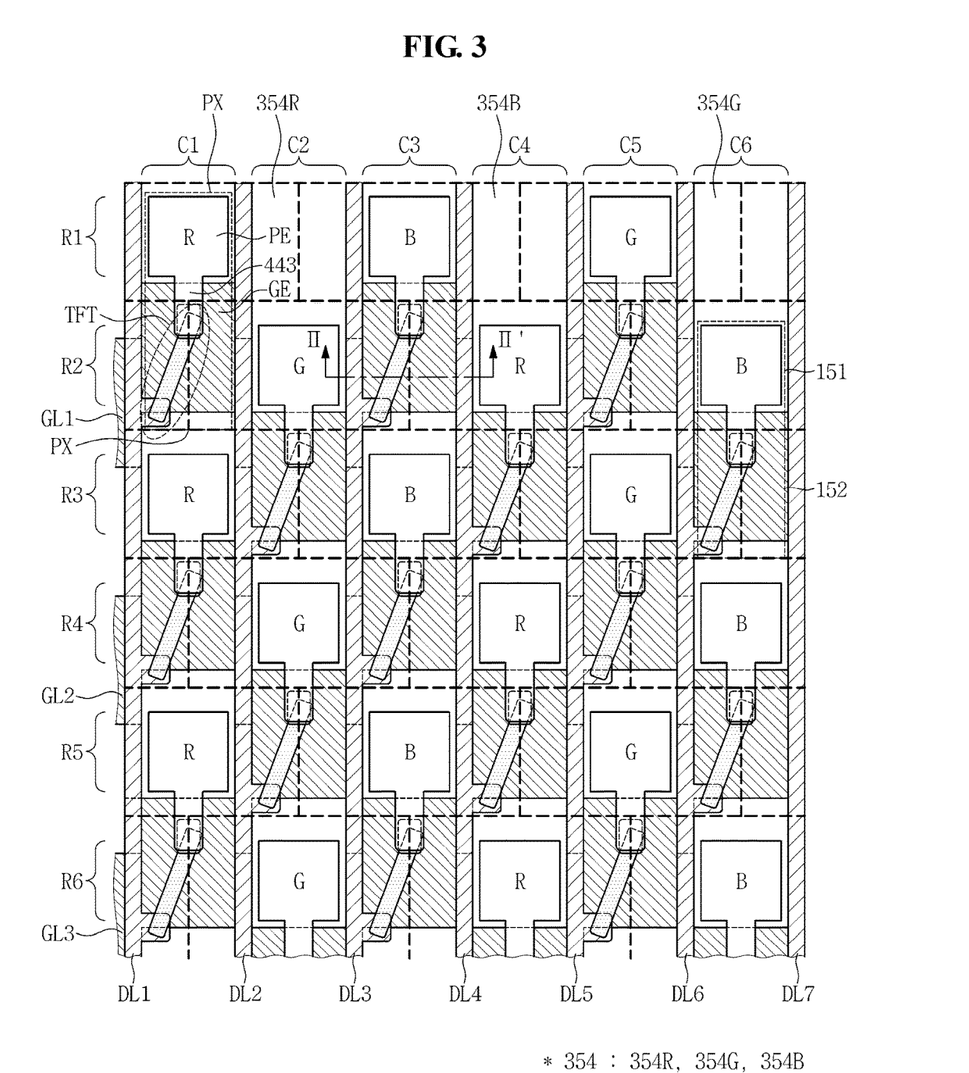
FIG. 3 is a view illustrating a part of a display device including a plurality of pixels having the structure illustrated in FIG. 1.
Figure 4:
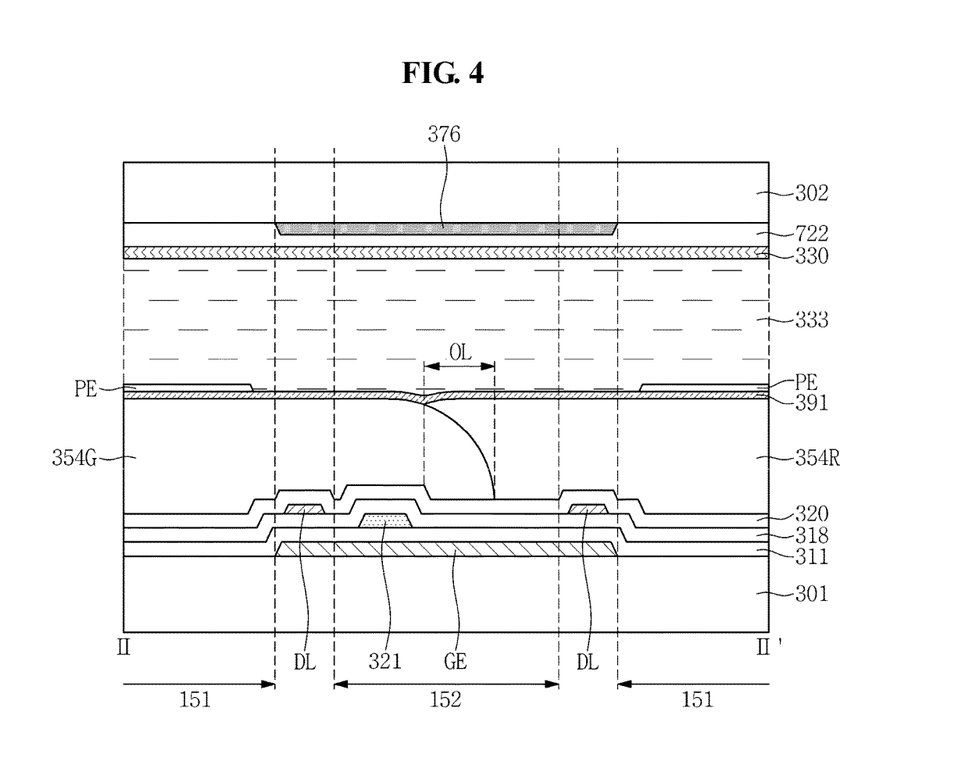
FIG. 4 is a cross-sectional view taken along line II-II' of FIG. 3.
Figure 5A:
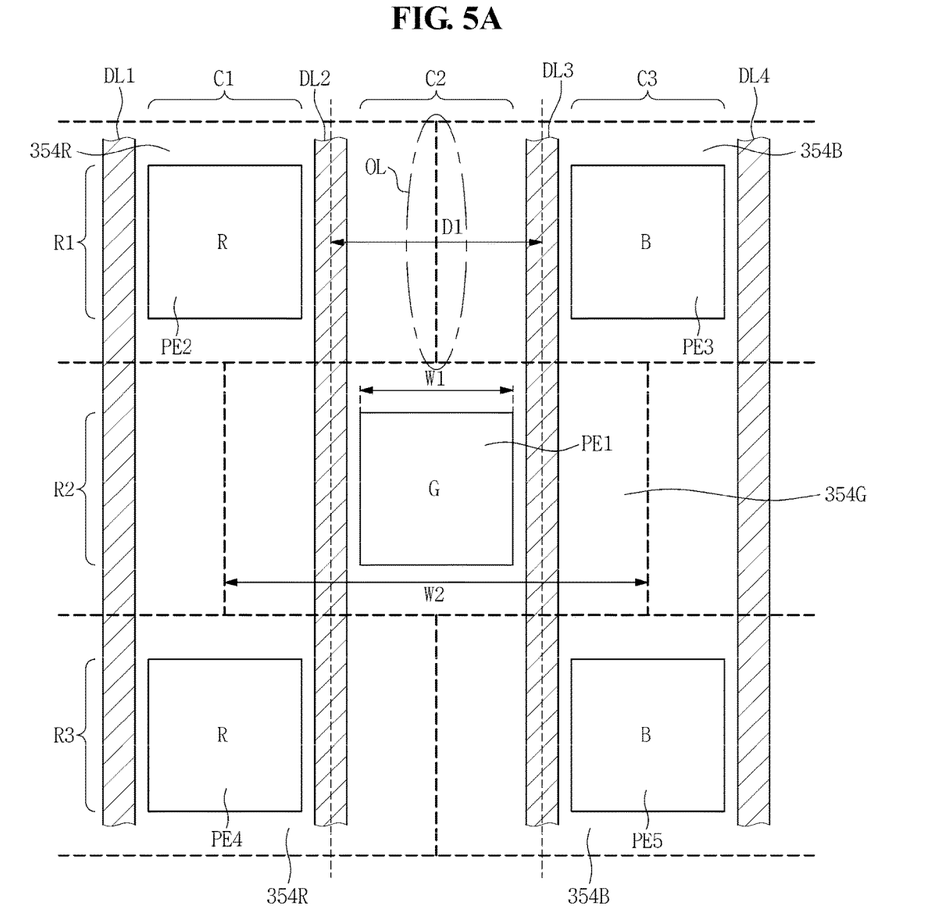
FIG. 5A is a view separately illustrating a plurality of pixel electrodes and color filters positioned at a predetermined portion in FIG. 3.
Figure 5B:
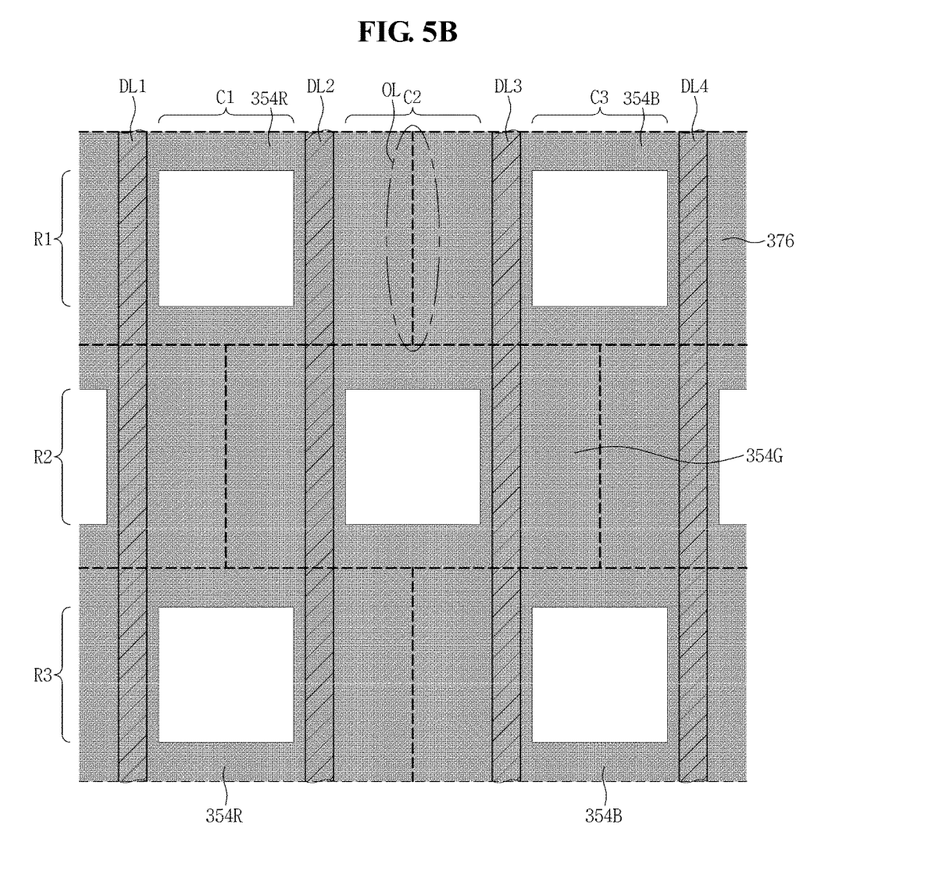
FIG. 5B is a view separately illustrating a plurality of color filters and a light blocking layer positioned at a predetermined portion in FIG. 3.

FIG. 3 is a view illustrating a part of a display device including a plurality of pixels having the structure illustrated in FIG. 1. FIG. 4 is a cross-sectional view taken along line II-II' of FIG. 3. FIG. 5A is a view separately illustrating a plurality of pixel electrodes and color filters positioned at a predetermined portion in FIG. 3. FIG. 5B is a view separately illustrating a plurality of color filters and a light blocking layer positioned at a predetermined portion in FIG. 3.

Each of the plurality of pixels PX illustrated in FIG. 3 may have a substantially same structure as that of the pixel PX of FIG. 1 described above. That is, each pixel PX in FIG. 3 may have a substantially same planar and cross-sectional structure as that of the pixel PX illustrated in FIG. 1.

Pixels PX in a certain column may be shifted further downwards or upwards than pixels PX in another column. For example, as illustrated in FIG. 3, pixels PX of even-numbered columns (one of C2, C4, and C6) are shifted further downwards along a longitudinal direction of the data line (e.g., a data line DL2) than pixels of odd-numbered columns (one of C1, C3, and C5). In other words, in the case where a data driver (not illustrated) for driving data lines DL1, DL2, DL3, DL4, DL5, DL6, and DL7 is positioned above the data lines DL1, DL2, DL3, DL4, DL5, DL6, and DL7 of FIG. 3, the pixels PX of the even-numbered columns may be arranged in order from an area (row) farther from the data driver than the pixels PX of the odd-numbered columns. In an exemplary embodiment, although not illustrated, the data line DL may have a zig-zag shape.

Accordingly, a TFT connected to a pixel electrode PE of a (2k−1)-th (k being a natural number) row may be positioned between two pixel electrodes PE that are adjacent to the pixel electrode PE of the (2k−1)-th row and positioned in a 2k-th row. For example, in FIG. 3, when a pixel electrode PE in the first row R1 and the third column C3 is defined as a first pixel electrode, a pixel electrode PE in the second row R2 and the second column C2 is defined as a second pixel electrode, and a pixel electrode PE in the second row R2 and the fourth column C4 is defined as a third pixel electrode, a TFT connected to the first pixel electrode is positioned between the second pixel electrode and the third pixel electrode.

TFTs respectively connected to the pixel electrodes PE in the (2k−1)-th row and TFTs respectively connected to the pixel electrodes PE in the 2k-th row may be connected in common to one gate line. For example, as illustrated in FIG. 3, TFTs respectively connected to the pixel electrodes PE in the first row R1 and TFTs respectively connected to the pixel electrodes PE in the second row R2 are connected in common to a first gate line GL1.

As the first gate line GL1 includes a plurality of gate electrodes GE connected to each other, odd-numbered gate electrodes GE may be respectively connected to TFTs for driving the pixel electrodes PE in the first row R1, and even-numbered gate electrodes GE may be respectively connected to TFTs for driving the pixel electrodes PE in the second row R2.

Thus, the first gate line GL1 including the plurality of gate electrodes GE arranged in the above-described manner may have a zig-zag shape. Another gate line may have a substantially same shape as that of the first gate line GL1. However, respective ones of the gate lines may not be connected to each other. For example, the first gate line GL1 and a second gate line GL2 are not connected to each other.

Pixel electrodes PE included in the odd-numbered rows (one of R1, R3, and R5) may be positioned in the odd-numbered columns (C1, C3, and C5). In other words, the pixel electrodes PE arranged along the odd-numbered row may be positioned between a (2x−1)-th (x being a natural number) data line and a 2x-th data line. For example, as illustrated in FIG. 3, pixel electrodes PE included in the first row R1 are positioned in the first column C1, the third column C3 and the fifth column C5, respectively. In other words, the pixel electrodes PE arranged along the first row R1 may be positioned between the first data line DL1 and the second data line DL2, between the third data line DL3 and the fourth data line DL4, and the fifth data line DL5 and the sixth data line DL6, respectively.

Pixel electrodes PE included in the even-numbered rows (one of R2, R4, and R6) may be positioned in the even-numbered columns (C2, C4, and C6). In other words, the pixel electrodes PE arranged along the even-numbered row may be positioned between the 2x-th data line and a (2x+

1)-th data line. For example, as illustrated in FIG. 3, pixel electrodes PE included in the second row R2 are positioned in the second column C2, the fourth column C4 and the sixth column C6, respectively. In other words, the pixel electrodes PE arranged along the second row R2 may be positioned between the second data line DL2 and the third data line DL3, the fourth data line DL4 and the fifth data line DL5, and between the sixth data line DL6 and the seventh data line DL7, respectively. However, an outermost pixel electrode PE of the pixel electrodes in the even-numbered row may be positioned between the data line and an edge of the first substrate 301.

Although not illustrated, the pixel electrodes PE included in the odd-numbered rows (one of R1, R3, and R5) may be positioned in the even-numbered columns (C2, C4, and C6), and the pixel electrodes PE included in the even-numbered rows (one of R2, R4, and R6) may be positioned in the odd-numbered columns (C1, C3, and C5). In such an exemplary embodiment, the pixel electrodes PE arranged along the odd-numbered row are positioned between the 2x-th data line and the (2x+1)-th data line, and the pixel electrodes PE arranged along the even-numbered row are positioned between the (2x−1)-th data line and the 2x-th data line Each pixel PX may be connected to one of data lines on opposite sides. For example, as illustrated in FIG. 3, each pixel PX may be connected to a data line positioned on its left side. The pixel PX may be connected to the data line through the TFT.

A pixel electrode PE of one of two adjacent rows may be not positioned between two adjacent pixel electrodes PE of the other of the two adjacent rows. For example, in FIG. 3, a pixel electrode in the second row R2 and the second column C2 is defined as a first pixel electrode, a pixel electrode positioned in the first row R1 and the first column C1 is defined as a second pixel electrode, and a pixel electrode positioned in the first row R1 and the third column C3 is defined as a third pixel electrode, no part of the first pixel electrode is positioned between the second pixel electrode and the third pixel electrode.

As such, as the adjacent pixel electrodes are adjacent to each other in the diagonal direction and a pixel electrode PE of one of two adjacent rows is not positioned between two adjacent pixel electrodes PE of the other of the two adjacent rows, a distance between pixel electrodes that are adjacent to each other and positioned in different rows, respectively, may increase. Accordingly, an electric field and the movement of liquid crystal molecules in one pixel may minimally affect an electric field or the movement of liquid crystal molecules in another pixel adjacent to said one pixel.

In FIG. 3, a reference character R on a pixel electrode PE denotes that a pixel PX including the pixel electrode PE may be a red pixel R for displaying a red color, a reference character G on a pixel electrode PE denotes that a pixel PX including the pixel electrode PE may be a green pixel G for displaying a green color, and a reference character B on a pixel electrode PE denotes that a pixel PX including the pixel electrode PE may be a blue pixel B for displaying a blue color.

Three pixels PX connected in common to one gate line and adjacent to each other may constitute one main pixel. For example, in FIG. 3, a red pixel R, a green pixel G, and a blue pixel B that are connected in common to the first gate line GL1 and are adjacent to each other may constitute one main pixel.

As illustrated in FIGS. 3 and 4, the color filter 354 overlaps the pixel electrode PE in the light transmitting area 151 and has an area larger than that of the pixel electrode PE.

In such an exemplary embodiment, the color filter 354 may have an area about twice to about three times the area of the pixel electrode PE. For example, in FIG. 3, when a pixel electrode PE in the first row R1 and the third column C3 is defined as a first pixel electrode and a color filter overlapping the first pixel electrode is defined as a first color filter, the first color filter has an area about twice to about three times the area of the first pixel electrode. In such an exemplary embodiment, the first color filter may be a blue color filter 354B.

An overlapping portion OL between color filters 354 that are adjacent to each other in the row direction may not be positioned on the pixel electrode PE but on a gate electrode GE of another pixel PX. That is, the overlapping portion OL between the color filters 354 may be positioned in the light blocking area 152 between pixel electrodes PE overlapping the respective ones of the color filters 354.

For example, an overlapping portion OL between color filters 354 overlapping pixel electrodes PE in a 2k-th (k being a natural number) row may be positioned in the light blocking area 152 in which a TFT adjacent to the pixel electrodes PE of the 2k-th row and connected to a pixel electrode PE in a (2k−1)-th row is positioned. For example, in FIG. 3, when a pixel electrode PE in the first row R1 and the third column C3 is defined as a first pixel electrode, a pixel electrode PE in the second row R2 and the second column C2 is defined as a second pixel electrode, a pixel electrode PE in the second row R2 and the fourth column C4 is defined as a third pixel electrode, and color filters 354 overlapping the first, second and third pixel electrodes are defined as first, second and third color filters, respectively, an overlapping portion OL of the second color filter and the third color filter may be positioned in a light blocking area 152 in which a TFT connected to the first pixel electrode is positioned. In such an exemplary embodiment, the first color filter is a blue color filter 354B, the second color filter is a green color filter 354G and the third color filter is a red color filter 354R.

A width of the overlapping portion OL according to an exemplary embodiment is less than a width of the light blocking area 152. For example, the width of the overlapping portion OL may be in a range from about 1 μm to about 2 μm and the width of the light blocking area 152 may be in a range from about 2.5 μm to about 3.0 Accordingly, even when misalignment occurs between the color filter 354 and the pixel electrode PE, the overlapping portion OL of the color filter 354 may be positioned in the light blocking area 152 and not in the light transmitting area 151. Thus, the width of the overlapping portion and the positioning of the color filters 354R and 354G substantially prevent color mixture or light leakage from the display device.

The arrangement of the pixel electrode PE, the color filter 354 and the light blocking layer 376 will be described in detail with reference to FIGS. 5A and 5B.

Referring to FIG. 5A, a pixel electrode PE in the second row R2 and the second column C2 is defined as a first pixel electrode PE1 and four pixel electrodes adjacent to the first pixel electrode PE1 and positioned in two different rows are defined as second, third, fourth, and fifth pixel electrodes PE2, PE3, PE4, and PE5, respectively. That is, a pixel electrode PE in the first row R1 and the first column C1 may be referred to as a second pixel electrode PE2, a pixel electrode PE in the first row R1 and the third column C3 may be referred to as a third pixel electrode PE3, a pixel electrode PE in the third row R3 and the first column C1 may be referred to as a fourth pixel electrode PE4, and a pixel electrode PE in the third row R3 and the third column C3 may be referred to as a fifth pixel electrode PE5. In addition, color filters overlapping the first, second, third, fourth, and fifth pixel electrodes PE1, PE2, PE3, PE4, and PE5 are defined as first, second, third, fourth, and fifth color filters, respectively. In such an exemplary embodiment, the first color filter may be a green color filter 354G, the second and fourth color filters may be red color filters 354R, and the third and fifth color filters may be blue color filters 354B.

In such an exemplary embodiment, a width of a pixel electrode PE in one of two adjacent rows is less than a distance between two data lines DL adjacent to the pixel electrode PE. The distance between the data lines DL may be defined as a distance D1 between imaginary straight lines extending along the center of the data line DL. For example, as illustrated in FIG. 5A, a width W1 of the first pixel electrode PE1 is less than a distance D1 between the second data line DL2 and the third data line DL3.

In addition, the color filter 354 may overlap the pixel electrode PE and have a width W2 that is larger than the distance between two data lines DL. For example, as illustrated in FIG. 5A, the first pixel electrode PE1 may overlap the first color filter 354G and a width W2 of the first color filter 354G is greater than the distance D1 between the second data line DL2 and the third data line DL3. In such an exemplary embodiment, the width W2 of the first color filter 354G may be about 1.3 times to about 2.5 times the distance D1 between the second data line DL2 and the third data line DL3.

In addition, the overlapping portion OL between color filters 354 adjacent to each other in the row direction may be positioned not on the pixel electrode PE, but on a gate electrode GE of another pixel PX. That is, the overlapping portion OL between the color filters 354 may be positioned in the light blocking area 152 between pixel electrodes PE overlapping the respective ones of the color filters 354. For example, as illustrated in FIG. 5A, an overlapping portion OL between the second pixel electrode PE2 and the third pixel electrode PE3 may be positioned not on the pixel electrode PE, but in the light blocking area 152. Similarly, an overlapping portion OL between the fourth pixel electrode PE4 and the fifth pixel electrode PE5 may be positioned not on the pixel electrode PE, but in the light blocking area 152.

Referring to FIG. 5B, the light blocking layer 376 is positioned at a remaining area except for the light transmitting area 151. That is, the light blocking layer 376 may be positioned in an area overlapping the gate line GL and the data line DL. In an exemplary embodiment, although not illustrated, the light blocking layer 376 may be omitted in an area overlapping the data line.

In the display device according to an exemplary embodiment, the overlapping portion of adjacent ones of the color filters 354 overlaps the light blocking layer 376 between adjacent light transmitting areas 151, and accordingly, even when misalignment occurs between the color filter 354 and the pixel electrode PE, the color mixture or light leakage may be substantially prevented from being recognized.

Figure 6:
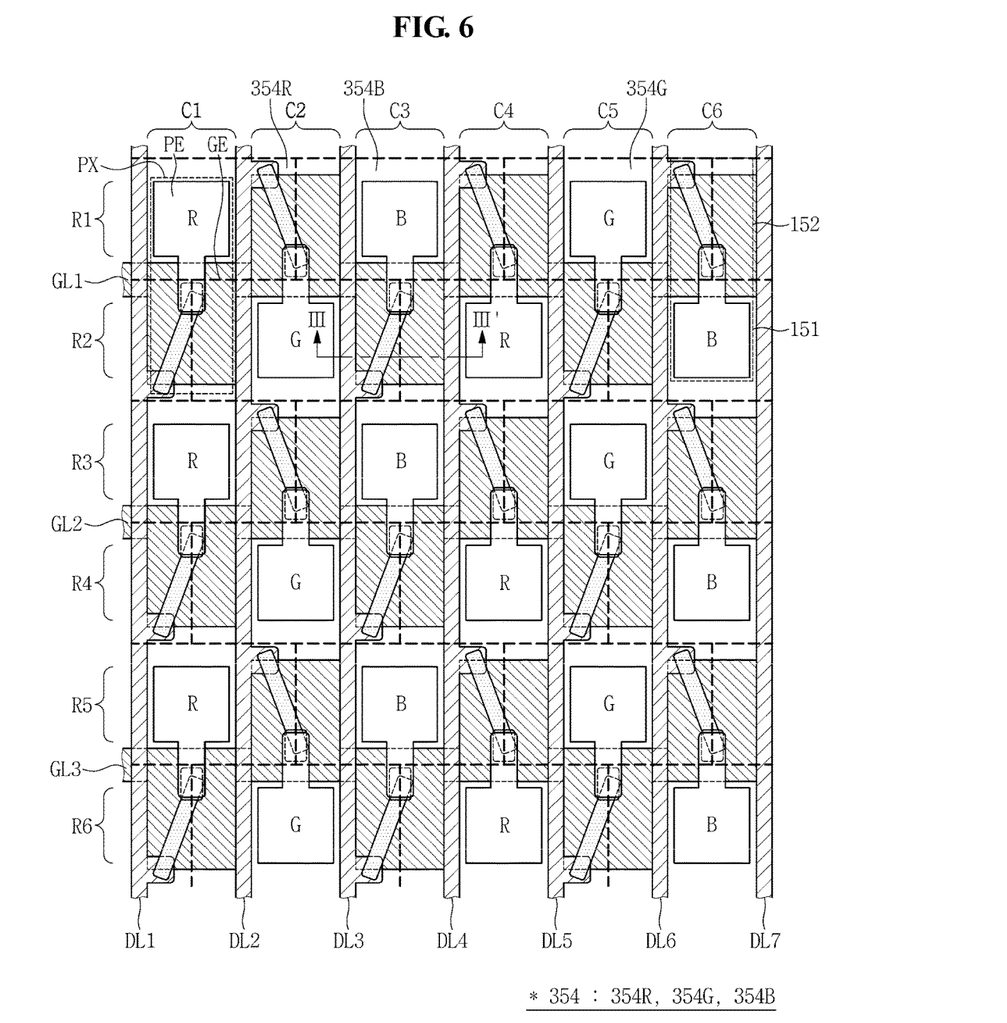
FIG. 6 is a view illustrating a part of a display device according to an alternative exemplary embodiment.
Figure 7:
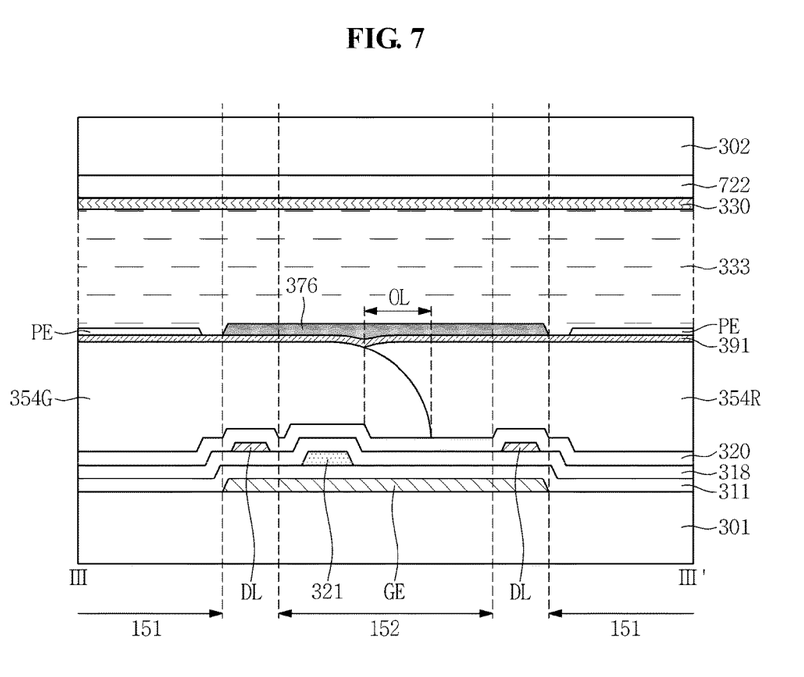
FIG. 7 is a cross-sectional view taken along line III-III' of FIG. 6.

FIG. 6 is a view illustrating a part of a display device according to an alternative exemplary embodiment, and FIG. 7 is a cross-sectional view taken along line III-III' of FIG. 6.

Each of a plurality of pixels PX illustrated in FIG. 6 may have a substantially same structure as that of the pixel PX of FIG. 1 described above. That is, each pixel PX in FIG. 6 may have a substantially same planar and cross-sectional structure as that of the pixel PX illustrated in FIG. 1.

Pixels PX in a certain column have opposite shapes to shapes of pixels PX in another column. For example, as illustrated in FIG. 6, pixels PX of even-numbered columns (one of C2, C4, and C6) have opposite shapes to shapes of pixels of odd-numbered columns (one of C1, C3, and C5). For example, each of pixels PX in the odd-numbered column has a substantially same shape as that of the pixel PX illustrated in FIG. 1 described above and each of pixels PX in the even-numbered column has a shape inverted by 180 degrees with respect to the shape of the pixel illustrated in FIG. 1. Accordingly, a TFT connected to a pixel electrode PE in a 2k-th row is positioned between two pixel electrodes PE adjacent to the pixel electrode PE in the 2k-th row and positioned in a (2k−1)-th row. For example, in FIG. 6, when a pixel electrode PE in the second row R2 and the second column C2 is defined as a first pixel electrode, a pixel electrode PE in the first row R1 and the first column C1 is defined as a second pixel electrode, and a pixel electrode PE in the first row R1 and the third column C3 is defined as a third pixel electrode, a TFT connected to the first pixel electrode is positioned between the second pixel electrode and the third pixel electrode.

In a display device according to an alternative exemplary embodiment, as illustrated in FIG. 7, a light blocking layer 376 is positioned on a first substrate 301. That is, the display device may have a black matrix on array (BOA) structure in which a TFT and the light blocking layer 376 are positioned on a substantially same substrate, such that the adhesion defect between the first substrate 301 and a second substrate 302 may be substantially minimized and the manufacturing process may be simplified.

The display device illustrated in FIGS. 6 and 7 may be substantially the same as the display device illustrated in FIGS. 3 and 4, except for the position of the TFT and the light blocking layer 376, and thus descriptions related to the components illustrated in FIGS. 6 and 7 will make reference to FIGS. 1, 2, 3, 4, 5A, and 5B and their related descriptions.

As set forth hereinabove, according to one or more exemplary embodiments, the occurrence of the color mixture or light leakage may be substantially prevented by disposing the color filter overlapping portion in the light blocking area where the TFT and the gate line are positioned.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a first substrate and a second substrate disposed facing each other;
   a plurality of gate lines, a first data line, and a second data line adjacent to the first data line disposed on the first substrate;
   a plurality of thin film transistors connected to the gate lines, the first data line, and the second data line;
   a plurality of pixel electrodes connected to the thin film transistors; and
   a plurality of color filters disposed on at least one of the first substrate and the second substrate, the color filters overlapping the pixel electrodes,
   wherein the color filters have a width greater than a distance between the first data line and the second data line, wherein the pixel electrodes of one of an odd-numbered row and an even-numbered row are only positioned in odd-numbered columns, wherein the pixel electrodes of the other of the odd-numbered row and the even-numbered row are only positioned in even-numbered columns, and wherein an overlapping portion between two adjacent color filters in one row is located between two adjacent pixel electrodes in one column on the plane.

2. The display device as claimed in claim 1, wherein the color filter has a width which is about 1.3 times to about 2.5 times the distance between the first data line and the second data line.

3. The display device as claimed in claim 2, wherein an overlapping portion between the color filters is not positioned on the pixel electrode.

4. The display device as claimed in claim 2, wherein an overlapping portion between the color filters is positioned on a gate electrode of another pixel.

5. The display device as claimed in claim 1, wherein two adjacent color filters in one row have different colors from a color of a color filter adjacent to said two adjacent color filters and positioned in another row.

6. The display device as claimed in claim 1, further comprising a light blocking layer positioned on at least one of the first substrate and the second substrate and overlapping the gate line.

7. The display device as claimed in claim 1, further comprising a light blocking layer positioned on at least one of the first substrate and the second substrate and overlapping the first and second data lines.

8. The display device as claimed in claim 1, wherein the pixel electrode of one of two adjacent rows is not positioned between two adjacent pixel electrodes of the other of the two adjacent rows.

9. The display device as claimed in claim 1, wherein thin film transistors respectively connected to the pixel electrodes in a (2k−1)-th row (k being a natural number) and thin film transistors respectively connected to the pixel electrodes in a 2k-th row are connected in common to one gate line.

10. The display device as claimed in claim 1, wherein the thin film transistor connected to the pixel electrode in the (2k−1)-th row (k being a natural number) is positioned between two pixel electrodes adjacent to the pixel electrode in the (2k−1)-th row and positioned in the 2k-th row.

11. The display device as claimed in claim 1, wherein the thin film transistor connected to the pixel electrode in the 2k-th row (k being a natural number) is positioned between two pixel electrodes adjacent to the pixel electrode in the 2k-th row and positioned in the (2k−1)-th row.

12. The display device as claimed in claim 1, wherein the gate lines have a zig-zag shape.

13. The display device as claimed in claim 1, wherein each of the first and second data lines has a zig-zag shape.

14. The display device as claimed in claim 1, wherein:
the pixel electrodes are positioned in a light transmitting area,
the thin film transistors and a plurality of gate electrodes are positioned in a light blocking area, and
an area ratio between the light transmitting area and the light blocking area is in a range from about 3:7 to about 4:6.

15. A display device, comprising:
a first substrate and a second substrate disposed facing each other;
a plurality of gate lines, a first data line, and a second data line adjacent to the first data line disposed on the first substrate;
a plurality of thin film transistors connected to the gate lines, the first data line, and the second data line;
a plurality of pixel electrodes connected to the thin film transistors; and
a plurality of color filters disposed on at least one of the first substrate and the second substrate, the color filters overlapping the pixel electrodes,
wherein the color filters have a width greater than a distance between the first data line and the second data line,
wherein the pixel electrodes of one of an odd-numbered row and an even-numbered row are only positioned in odd-numbered columns,
wherein the pixel electrodes of the other of the odd-numbered row and the even-numbered row are only positioned in even-numbered columns, and
wherein the thin film transistors respectively connected to the pixel electrodes in a (2k−1)-th row (k being a natural number) and the thin film transistors respectively connected to the pixel electrodes in a 2k-th row are connected in common to one gate line.

16. A display device, comprising:
a first substrate and a second substrate disposed facing each other;
a plurality of gate lines, a first data line, and a second data line adjacent to the first data line disposed on the first substrate;
a plurality of thin film transistors connected to the gate lines, the first data line, and the second data line;
a plurality of pixel electrodes connected to the thin film transistors; and
a plurality of color filters disposed on at least one of the first substrate and the second substrate, the color filters overlapping the pixel electrodes,
wherein the color filters have a width greater than a distance between the first data line and the second data line,
wherein the pixel electrodes of one of an odd-numbered row and an even-numbered row are only positioned in odd-numbered columns,
wherein the pixel electrodes of the other of the odd-numbered row and the even-numbered row are only positioned in even-numbered columns, and
wherein the thin film transistor connected to the pixel electrode in the (2k−1)-th row (k being a natural number) is positioned between two pixel electrodes adjacent to the pixel electrode in the (2k−1)-th row and positioned in the 2k-th row.

* * * * *